(12) United States Patent
Shin

(10) Patent No.: US 7,550,373 B2
(45) Date of Patent: Jun. 23, 2009

(54) METHOD OF FORMING A SALICIDE LAYER FOR A SEMICONDUCTOR DEVICE

(75) Inventor: Hyun Sun Shin, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,076

(22) Filed: Dec. 29, 2004

(65) Prior Publication Data

US 2005/0142736 A1 Jun. 30, 2005

(30) Foreign Application Priority Data

Dec. 30, 2003 (KR) .................... 10-2003-0100951

(51) Int. Cl.
*H01L 21/3205* (2006.01)
(52) U.S. Cl. ...................... 438/592; 438/286
(58) Field of Classification Search .............. 438/286, 438/592
See application file for complete search history.

(56) References Cited

U.S. PATENT DOCUMENTS

| 6,025,267 | A | * | 2/2000 | Pey et al. ................ 438/656 |
| 6,537,884 | B1 | * | 3/2003 | Yogo et al. .............. 438/286 |
| 6,897,504 | B2 | * | 5/2005 | Yaung et al. ............ 257/296 |

\* cited by examiner

*Primary Examiner*—Jack Chen
(74) *Attorney, Agent, or Firm*—The Law Offices of Andrew D. Fortney; Andrew D. Fortney; William K. Nelson

(57) ABSTRACT

Methods of fabricating semiconductor devices are disclosed. An illustrated example method protects spacers and active areas by performing impurity ion implantation on an oxide layer prior to etching the oxide layer. The illustrated method includes forming a gate on a semiconductor substrate, forming a spacer on a sidewall of the gate, forming an oxide layer over the substrate, forming a mask on the oxide layer to cover a non-salicide area, implanting impurity ions into a portion of the oxide layer which is not covered by the mask, removing the portion of the oxide layer which is implanted with impurity ions, performing salicidation on the substrate, and removing the mask.

17 Claims, 4 Drawing Sheets

METHOD OF FORMING A SALICIDE LAYER FOR A SEMICONDUCTOR DEVICE

FIELD OF THE DISCLOSURE

The present disclosure relates generally to semiconductor fabrication and, more particularly, to methods of fabricating semiconductor devices in which a non-silicide or non-salicide area is protected when forming a salicide layer in order to secure a resistance of the protected area.

BACKGROUND

Generally, in order to lower the resistance of a polysilicon gate electrode to accommodate a decrease in a critical dimension in CMOS device fabrication, a silicide layer is formed on the gate electrode. Since silicidation or salicidation is an optional process, a non-silicide or non-salicide area having no silicide may be formed on a specific portion of a device that requires higher resistance then the gate electrode.

A prior art method of forming a non-salicide area includes: forming a gate and spacers on a semiconductor substrate, forming an oxide layer thereon, forming a photoresist pattern covering an area that is not to be covered with salicide, removing the portions of the oxide layer which are not covered by the photoresist pattern, and forming a Ti- or Co-silicide layer on the uncovered areas. Thus, the non-salicide area is formed by preventing the silicide layer from being formed on the area covered by the photoresist pattern. The oxide layer is etched by wet etching, plasma dry etching (e.g., anisotropic etching), or by wet and dry etching using the photoresist pattern as an etch mask.

However, in the prior art method, if the oxide layer is wet etched, the etchant solution undercuts beneath the spacers. If, on the other hand, dry etching is performed, plasma damage occurs. Consequently, gate leakage is generated or the threshold voltage of the fabricated transistor is changed.

BRIEF DESCRIPTION OF THE DRAWINGS

Wherever possible, the same reference numbers will be used throughout the drawings to refer to the same or like parts.

DETAILED DESCRIPTION

Figure 1:
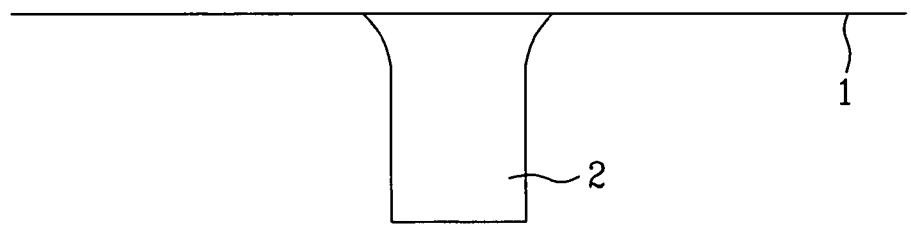
FIGS. 1 to 9 are cross-sectional views illustrated an example method of fabricating a semiconductor device performed in accordance with the teachings of the present invention.

FIGS. 1 to 9 are cross-sectional views illustrating example methods of fabricating a semiconductor device constructed in accordance with the teachings of the present invention. Referring to FIG. 1, an STI (shallow trench isolation) layer 2 is formed in a silicon substrate 1 to define left and right active areas in the silicon substrate 1.

Figure 2:
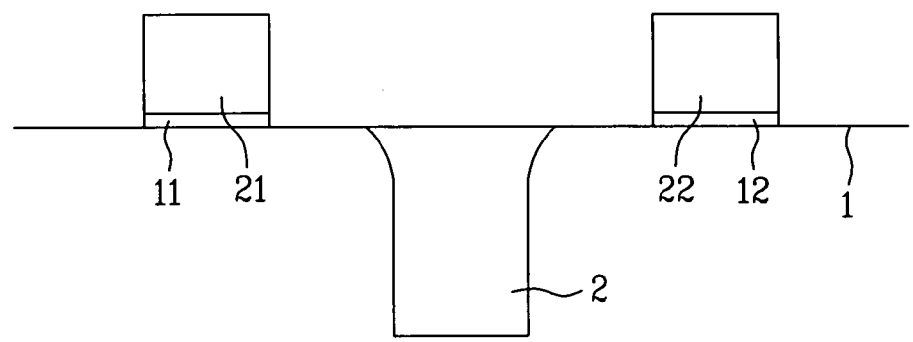

Referring to FIG. 2, an insulating layer is formed on the substrate 1. A polysilicon layer is then deposited on the insulating layer.

The polysilicon and insulating layers are patterned by photolithography to form a pair of gate electrodes 21 and 22 on the left and right active areas, respectively. Gate insulating layers 11 and 12 are located underneath respective ones of the gate electrodes 21 and 22.

Figure 3:
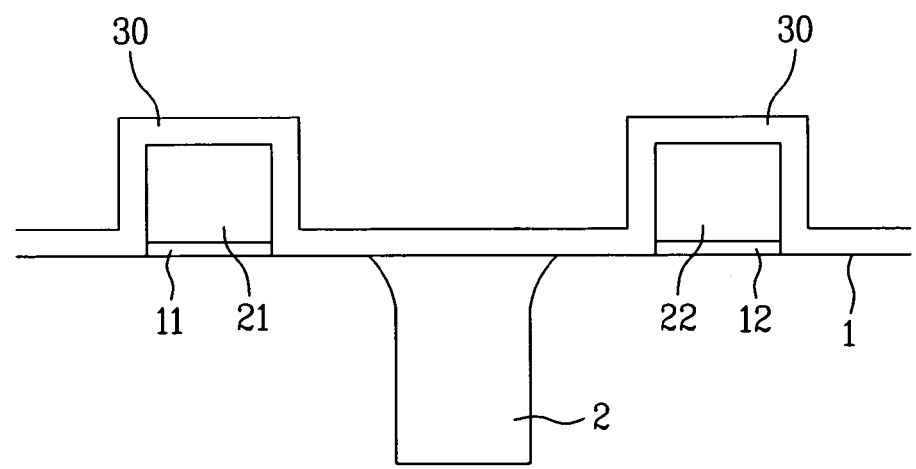

Referring to FIG. 3, a first oxide layer 30 is formed as a protective layer on the substrate 1 and the gate electrodes 21 and 22. Optionally, the protective layer 30 can be formed of a double layer including an oxide layer and a TEOS layer.

Figure 4:
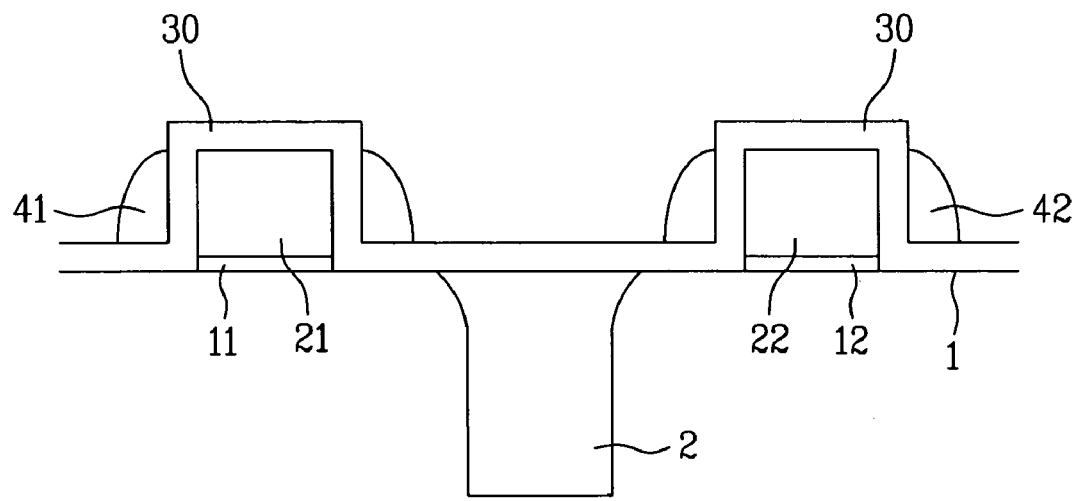

Referring to FIG. 4, a nitride (SiN) layer is formed on the first oxide layer 30. The nitride layer is etched back to form spacers 41 and 42 on sidewalls of the gate electrodes 21 and 22, respectively.

Figure 5:
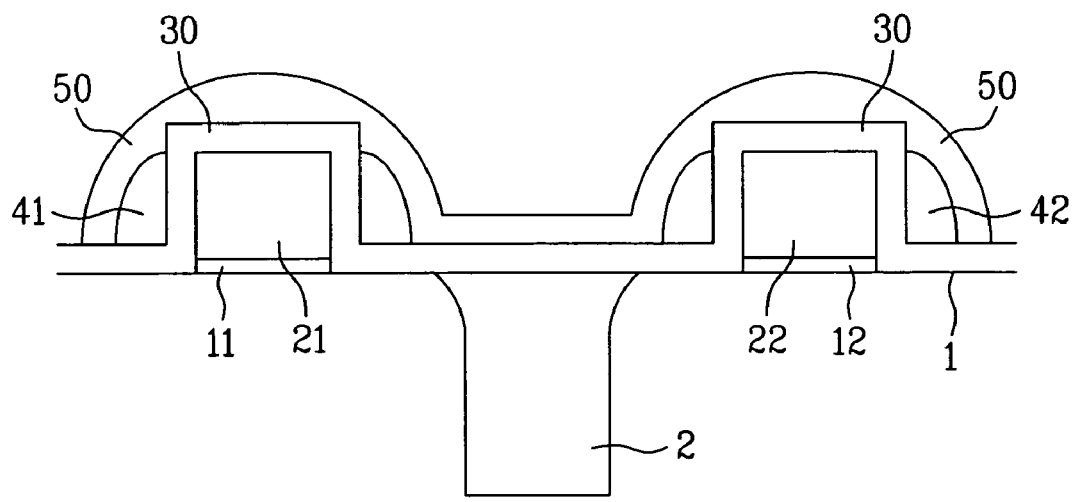

Referring to FIG. 5, a second oxide layer 50 is formed on the spacers 41 and 42 and on the first oxide layer 30.

Figure 6:
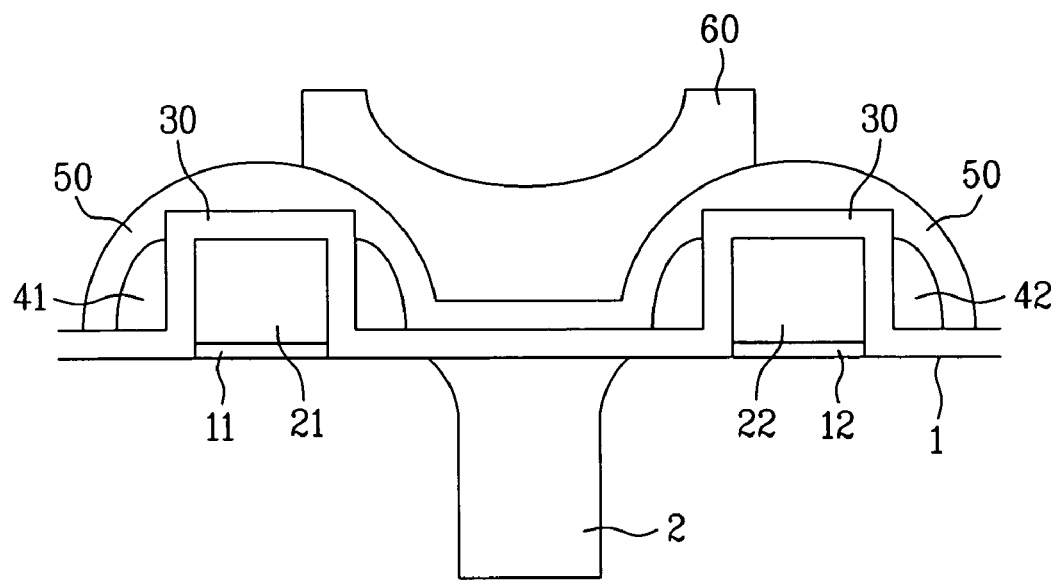

Referring to FIG. 6, a photoresist layer is coated on the second oxide layer 50. The photoresist layer is selectively exposed and developed to form a photoresist pattern 60 covering only a non-salicide area.

Figure 7:
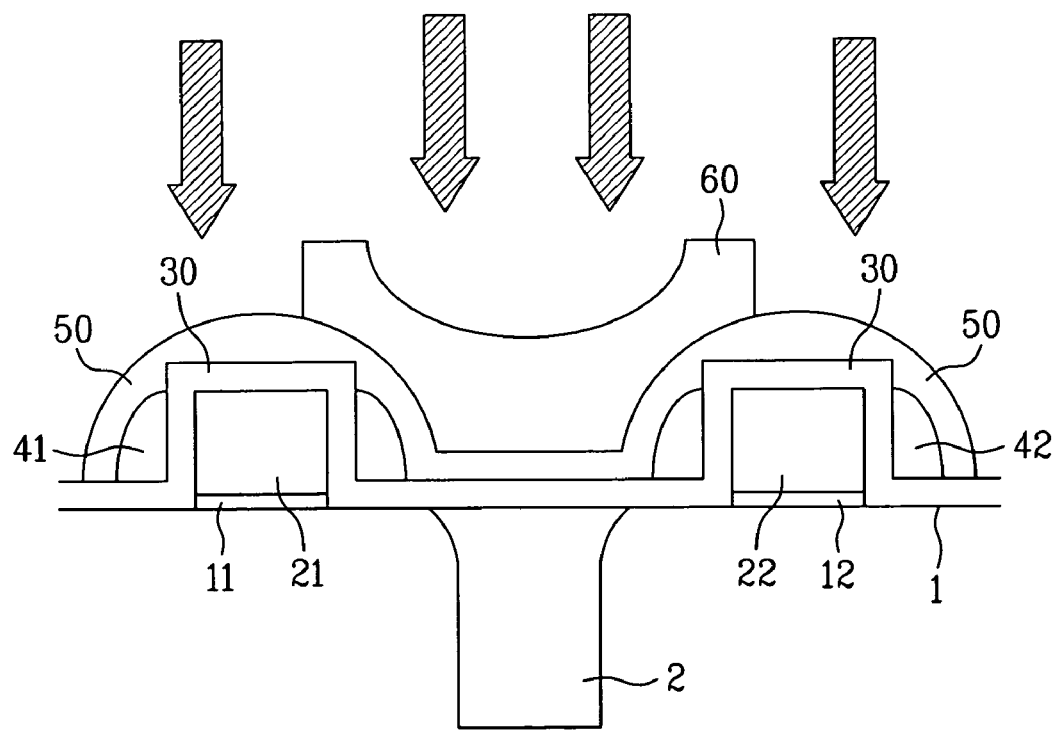

Referring to FIG. 7, impurity ions are implanted in the substrate 1 including in the second oxide layer 50. In the illustrated example, the implanted impurity ion species are Ge, As, $BF_2$, Ar, P, In, Sb, and/or the like. In the illustrated example, the implantation process is performed at a dose of about $1E^{12} \sim 1E^{16}$ ions/cm$^2$ with an implantation energy of about 5~160 KeV.

Figure 8:
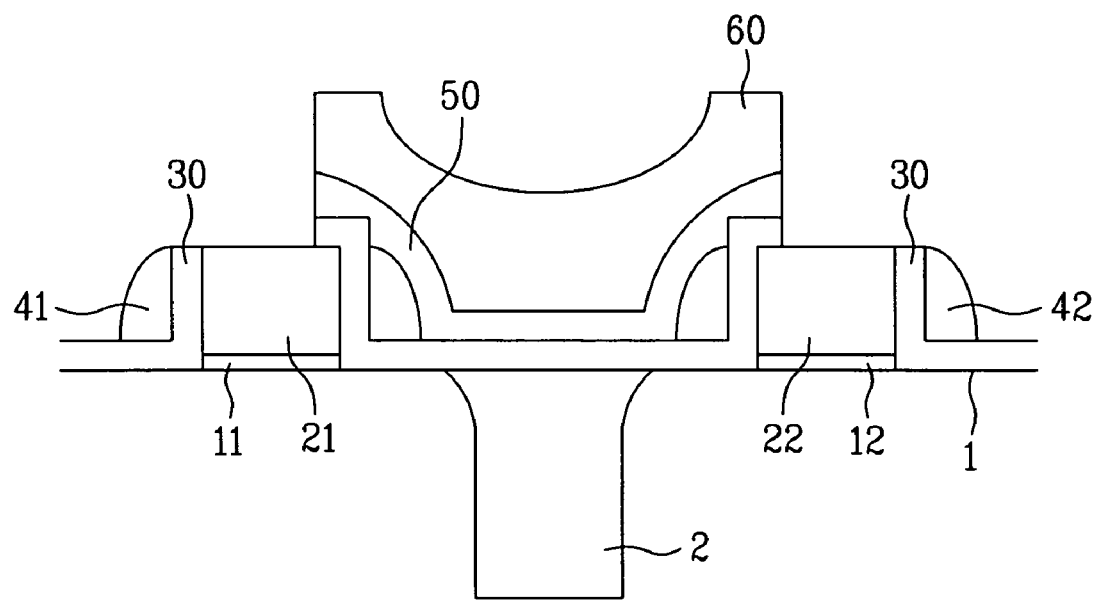

Referring to FIG. 8, wet etching is performed on the substrate using the photoresist pattern 60 as an etch mask to remove portions of the oxide layers 30 and 50, thereby exposing salicide forming areas, (e.g., the topsides of the gate electrodes 21 and 22 and portions of the active areas of the substrate 1).

Since the ion implantation process is performed prior to wet etching the first and second oxide layers 30 and 50, the coherence of the oxide layers is weakened, thereby accelerating their etch rates during the wet etching process. As a result, the time taken for the spacers 41 and 42 and the active areas to be exposed by an etchant solution is reduced. Therefore, the undercut between the spacer 41 or 42 and the active areas of the substrate 1 can be minimized.

The removal of the oxide layers 30 and 50 for salicidation may be performed by plasma dry etching (e.g., anisotropic etching), by wet etching, or by mixed dry and wet etching. If dry etching is performed, the ion implantation is performed after completion of the dry etching, (i.e., after the process described in connection with FIG. 8). If mixed dry and wet etching is performed, the dry etching, ion implantation, and wet etching are executed in the order listed in this sentence. Since the ion implantation is performed after dry etching, impurity ions penetrate the active areas damaged by the dry etching process to help salicidation.

Figure 9:
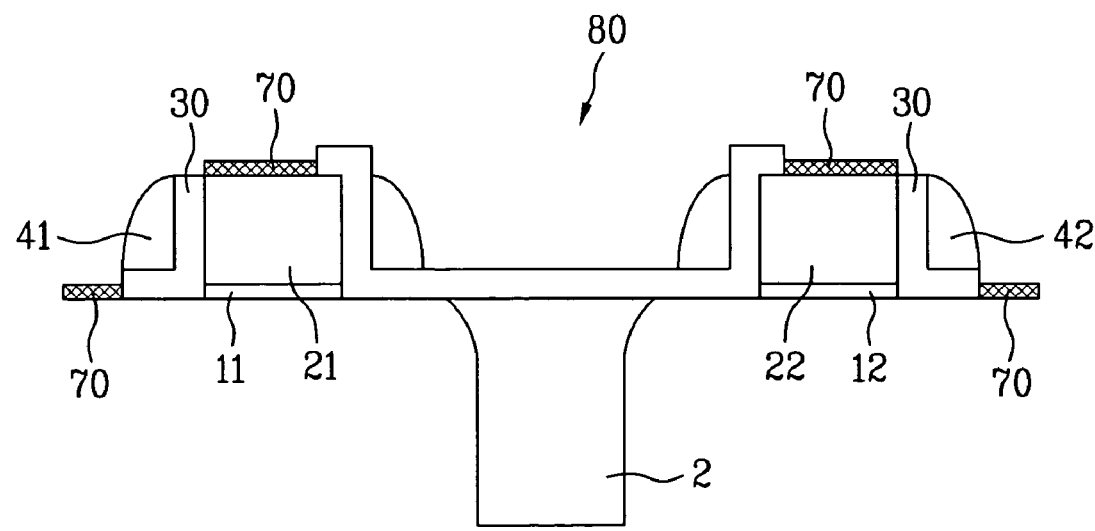

Referring to FIG. 9, a metal layer of Ti, Co, or the like is deposited over the substrate 1 including over the exposed topsides of the gates 21 and 22 and the exposed active areas of the substrate 1. This metal layer is then annealed to form a salicide layer 70. The portion of the metal layer which fails to react with the silicon is removed.

Thereafter, the photoresist pattern is removed to open a non-salicide area 80.

From the foregoing, persons of ordinary skill in the art will appreciate that, by performing the ion implantation prior to wet etching to selectively remove the oxide layers, the coherence of the oxide layers is weakened and their etch rates are accelerated in the subsequent wet etching process. As a result, the time taken for the spacers and the active areas to be exposed by an etchant solution is reduced. Consequently, the undercut between the spacers and the active areas of the substrate 1 can be minimized.

Moreover, because the additional ion implantation is performed after dry etching, impurity ions penetrate the active areas damaged by the dry etching process to help salicidation. Consequently, separate ion implantation is unnecessary for salicidation.

From the foregoing, persons of ordinary skill in the art will readily appreciate that methods of fabricating semiconductor devices have been disclosed by which spacers and active areas are protected by performing impurity ion implantation on an oxide layer prior to etching the oxide layer.

A disclosed example method of fabricating a semiconductor device comprises: forming a gate having a gate insulating layer on a semiconductor substrate, forming a spacer on a sidewall of the gate, forming an oxide layer over the substrate, forming a mask on the oxide layer to cover a non-salicide area, implanting impurity ions into an area of the oxide layer which is not covered by the mask, removing the area of the oxide layer which is implanted with impurity ions, performing salicidation on the substrate, and removing the mask.

Preferably, the area of the oxide layer which is implanted with impurity ions is removed by wet etching.

Preferably, the mask is formed of a photoresist pattern.

Another disclosed example method of fabricating a semiconductor device comprises: forming a gate having a gate insulating layer on a semiconductor substrate, forming a spacer on a sidewall of the gate, forming an oxide layer over the substrate, forming a mask on the oxide layer to cover a non-salicide area, removing a portion of the oxide layer which is not covered by the mask by dry etching, performing ion implantation on the substrate, performing salicidation on the substrate, and removing the mask.

Preferably, the impurity ions comprise at least one of Ge, As, $BF_2$, Ar, P, In, or Sb.

Preferably, the ion implantation is performed at a dose of about $1E^{12}$~$1E^{16}$ ions/cm$^2$ with implantation energy of about 5~160 KeV.

Preferably, the salicidation is performed using Ti or Co.

It is noted that this patent claims priority from Korean Patent Application Ser. No. P2003-0100951, which was filed on Dec. 30, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a semiconductor device comprising:
   forming a gate of a transistor on a semiconductor substrate;
   forming a spacer on a sidewall of the gate;
   forming an oxide layer over the gate, the sidewall and the substrate in an active area of the transistor;
   forming a mask on the oxide layer to cover a non-salicide area of the transistor active area on one side of the gate, leaving a portion of the oxide layer over the transistor active area on an opposite side of the gate unmasked;
   dry etching the unmasked portion of the oxide layer;
   performing ion implantation on the substrate;
   saliciding the substrate under the dry etched portion of the oxide layer; and
   removing the mask after performing the ion implantation and after saliciding the substrate.

2. A method as defined in claim 1, wherein the ions in the ion implantation comprise at least one of Ge, As, $BF_2$, Ar, P, In, or Sb.

3. A method as defined in claim 1, wherein the ion implantation is performed at a dose of about $1E^{12}$~$1E^{16}$ ions/cm$^2$ at an implantation energy of about 5~160 KeV.

4. A method as defined in claim 1, wherein saliciding comprises depositing Ti or Co.

5. A method as defined in claim 1, wherein forming the mask on the oxide layer also covers a non-salicide area of the gate and leaves at least a portion of the oxide layer over the gate unmasked.

6. A method as defined in claim 5, further comprising dry etching the unmasked portion of the oxide layer over the gate.

7. A method as defined in claim 6, further comprising saliciding the gate under the dry etched portion of the oxide layer.

8. A method as defined in claim 7, wherein saliciding the gate and substrate comprises depositing a metal on the exposed portion of the gate and the non-salicide area of the transistor, annealing the metal to form a silicide, and removing unreacted metal.

9. A method as defined in claim 1, wherein saliciding the substrate comprises depositing a metal on the substrate under the dry etched portion of the oxide layer, annealing the metal to form a salicide, and removing unreacted metal.

10. A method as defined in claim 1, wherein the spacer comprises nitride.

11. A method as defined in claim 1, further comprising wet etching the unmasked portion of the oxide layer, after performing the ion implantation and after the dry etching.

12. A method of fabricating a semiconductor device comprising:
   dry etching an unmasked portion of an oxide layer over a gate of a transistor, a spacer on a sidewall of the gate, and an active area of the transistor on one side of the gate, wherein a mask on the oxide layer covers a non-salicide area of the transistor active area on an opposite side of the gate;
   performing ion implantation on the substrate;
   saliciding the substrate under the dry etched portion of the oxide layer; and
   removing the mask after performing the ion implantation and after saliciding the substrate.

13. A method as defined in claim 12, wherein the ions in the ion implantation comprise at least one of Ge, As, $BF_2$, Ar, P, In, or Sb.

14. A method as defined in claim 12, wherein the ion implantation is performed at a dose of about $1E^{12}$~$1E^{16}$ ions/cm$^2$ at an implantation energy of about 5~160 KeV.

15. A method as defined in claim 12, wherein saliciding comprises depositing Ti or Co.

16. A method as defined in claim 12, wherein the spacer comprises nitride.

17. A method as defined in claim 12, further comprising wet etching the unmasked portion of the oxide layer, after performing the ion implantation and after the dry etching.

* * * * *

UNITED STATES PATENT AND TRADEMARK OFFICE
CERTIFICATE OF CORRECTION

PATENT NO. : 7,550,373 B2  
APPLICATION NO. : 11/027076  
DATED : June 23, 2009  
INVENTOR(S) : Hyun Su Shin It is certified that error appears in the above-identified patent and that said Letters Patent is hereby corrected as shown below:

On the Title Pg.
The name of the Inventor of the issued patent at Item (75), change "Hyun Sun Shin" to --Hyun Su Shin--.

Signed and Sealed this

Fifteenth Day of September, 2009

David J. Kappos  
*Director of the United States Patent and Trademark Office*